United States Patent
Maier et al.

(10) Patent No.: US 7,391,212 B2
(45) Date of Patent: Jun. 24, 2008

(54) RESONATOR APPARATUS FOR ELECTRON SPIN RESONANCE (ESR) MEASUREMENTS AND METHOD FOR MEASURING ELECTRON SPIN RESONANCE (ESR) SIGNALS

(75) Inventors: Diether Maier, Rheinstetten (DE); Dieter Schmalbein, Burbach (DE); Andreas Kamlowski, Karlsruhe (DE); Marian Kloza, Waldbronn (DE); Peter Hoefer, Ettlingen (DE)

(73) Assignee: Bruker BioSpin GmbH, Rheinstetten-Forchheim (DE)

( * ) Notice: Subject to any disclaimer, the term of this patent is extended or adjusted under 35 U.S.C. 154(b) by 745 days.

(21) Appl. No.: 10/197,236

(22) Filed: Jul. 15, 2002

(65) Prior Publication Data
US 2003/0155916 A1 Aug. 21, 2003

(30) Foreign Application Priority Data
Feb. 20, 2002 (DE) ............................... 102 07 725

(51) Int. Cl.
*G01V 3/00* (2006.01)
(52) U.S. Cl. ....................................... 324/316; 324/321
(58) Field of Classification Search .......... 324/300–322
See application file for complete search history.

(56) References Cited

U.S. PATENT DOCUMENTS

| | | | | |
|---|---|---|---|---|
| 4,386,054 A | * | 5/1983 | Takeuchi et al. ............. | 422/63 |
| 4,437,063 A | | 3/1984 | Biehl et al. | |
| 4,453,147 A | * | 6/1984 | Froncisz et al. ............. | 333/219 |
| 4,551,694 A | * | 11/1985 | Biehl et al. ................ | 333/24 C |
| 5,345,203 A | | 9/1994 | Gentsch et al. | |
| 5,469,061 A | * | 11/1995 | Linehan et al. ............. | 324/321 |
| 5,583,432 A | * | 12/1996 | Barnes ....................... | 324/204 |
| 5,585,722 A | * | 12/1996 | Hosoki et al. ............... | 324/318 |
| 5,598,097 A | * | 1/1997 | Scholes et al. .............. | 324/316 |
| 5,781,011 A | * | 7/1998 | Scholes et al. .............. | 324/316 |
| 6,101,015 A | * | 8/2000 | Budil et al. ................. | 324/316 |
| 6,396,274 B1 | * | 5/2002 | Commens et al. ........... | 324/321 |
| 6,462,546 B1 | * | 10/2002 | Schmalbein et al. ........ | 324/316 |
| 6,627,461 B2 | * | 9/2003 | Chapman et al. ............ | 436/536 |
| 6,791,324 B2 | * | 9/2004 | Maier et al. ................. | 324/316 |
| 6,828,789 B2 | * | 12/2004 | Hyde et al. ................. | 324/316 |
| 7,088,101 B2 | * | 8/2006 | Mett et al. .................. | 324/321 |

FOREIGN PATENT DOCUMENTS

| | | |
|---|---|---|
| JP | 02001580 A | 1/1990 |
| WO | WO 01/36994 A1 | 5/2001 |

* cited by examiner

*Primary Examiner*—Brij Shrivastav
*Assistant Examiner*—Dixomara Vargas
(74) *Attorney, Agent, or Firm*—Law Offices of Paul E. Kudirka

(57) ABSTRACT

A resonator apparatus and a method for electron spin resonance (ESR) measurements are disclosed. The resonator apparatus comprises a dielectric resonator and a sample vessel extending through the resonator. The sample vessel is configured as one single flexible tube. Means are provided for conveying a liquid sample substance through the flexible tube. According to the method a liquid sample substance is guided through the sample vessel, wherein the sample substance is gated by cyclically conveying and stopping, resp., a flow of the sample substance. A measurement is conducted within the resonator when the flow of sample substance is stopped.

17 Claims, 2 Drawing Sheets

RESONATOR APPARATUS FOR ELECTRON SPIN RESONANCE (ESR) MEASUREMENTS AND METHOD FOR MEASURING ELECTRON SPIN RESONANCE (ESR) SIGNALS

FIELD OF THE INVENTION

The invention, generally, relates to the field of electron spin resonance (ESR) spectroscopy.

More specifically, the invention is related to certain ESR measurements conducted on liquid samples, in particular liquid foodstuffs.

The invention, still more specifically, relates to a resonator apparatus for electron spin resonance (ESR) measurements, comprising a dielectric resonator and a sample vessel extending through the resonator.

The invention, further, is related to a method of measuring electron spin resonance (ESR) signals within a resonator, wherein a liquid sample substance is guided through a sample vessel extending through the resonator.

BACKGROUND OF THE INVENTION

Document DE 41 25 655 A1 discloses a resonator apparatus for electron spin resonance spectroscopy. This prior art resonator apparatus utilizes a dielectric resonator ring. The microwave energy required for exciting the resonance is fed via a coaxial cable terminating in a coupling loop. The coupling loop serves as an antenna located in the exterior area of the resonance ring, and is adapted to be displaced in a direction parallel to the axis thereof. A conventional sample tube, closed at its bottom, is used as the sample vessel, and, therefore, the sample tube contains a solid sample substance.

Therefore, this prior art apparatus, as disclosed, is not suitable for measuring liquid samples.

Document DE 30 29 754 A1 discloses a probe head for electron spin resonance measurements. This prior art probe head, too, utilizes a dielectric resonance ring as a resonant element. However, in this prior art probe head the microwave excitation is effected via a hollow waveguide and a slit iris for coupling microwave energy into the resonance ring.

This prior art probe head, too, is only suited for measuring solid samples.

Document WO 01/36994 A1 discloses a method and an apparatus for investigating the durability of liquid food stuffs by means of electron spin resonance.

According to the described method, the durability of beer is preferably determined by means of electron spin resonance. For that purpose, the prior art apparatus utilizes a sample vessel provided with a plurality of elongate sample areas having a minimum radial dimension. The sample vessel either consists of a solid block having a corresponding plurality of axial bores, or is made up of a bundle of capillaries. The probe vessel extends through a hollow cavity. The liquid sample substance flows through the cavity at a location where the magnetic field strength is at a maximum because all bores or capillaries are located in that area of maximum magnetic field strength.

These prior art apparatuses, however, have the disadvantage that the extremely thin sample channels tend to clog. For example, one individual thin sample channel may be clogged either by a solid particle within the liquid sample substance, or by gas bubbles contained within the sample substance. This may happen mainly in connection with those sample substances having a gas diluted therein, such as, for example, beer or other carbonated food stuffs. In that case, the result of the measurement is substantially affected. Moreover, with these prior art apparatuses the cleaning of the capillary-like sample channels presents a problem.

Finally, it is generally known in the art of electron spin resonance measurements on liquid samples to use so-called "flat cells", as are used within hollow cavity resonators for the conventional $TE_{102}$ mode of excitation. The term "flat cell" designates a sample vessel consisting of an originally cylindrical glass tube being compressed over a certain axial length so that only a flat parallelepiped sample volume remains in that flattened area.

Flat cells, however, also have the disadvantage that rinsing and cleaning presents a problem because the sample substance does not flow sufficiently through the lateral corners in the transition between the circular cylindrical and the flat section of the flat cell.

All prior art apparatuses, further, have the common disadvantage that the sample vessels, to the extent as they are configured for a sample substance flowing therethrough, always have to be connected within the experimental setup via special couplings and fittings which conventionally consist of metal and, hence, tend to corrode. Finally, not all prior art sample assemblies are adapted for measurements on liquid samples that are at an elevated temperature of, for example, 60° C.

It is, therefore, an object underlying the present invention to provide an improved resonator apparatus as well as a corresponding method, such that the aforementioned disadvantages are avoided. In particular, the invention shall enable fast, undisturbed and sensitive measurements on liquid sample substances, and allow a quick change between sample substances without needing to change the sample vessel.

SUMMARY OF THE INVENTION

In accordance with the present invention, a sample vessel is provided that is configured as one single flexible tube, and means are provided for conveying a liquid sample substance through the flexible tube.

The present invention also provides a method in which the sample substance is gated by cyclically conveying and stopping, respectively, a flow of the sample substance, and a measurement is conducted within the resonator when the flow of the sample substance is stopped.

By utilizing a single flexible tube as a sample vessel, all disadvantages of the prior art relating to the clogging of individual capillaries are avoided, as well as the problem of insufficient flow through certain sample vessel sections. An individual flexible tube has a minimum hydrodynamic flow resistance and, when dimensioned with a sufficient diameter, encloses a sufficient amount of sample substance to ensure a satisfactory signal-to-noise ratio. A high dielectric load on the resonator, with corresponding losses, is unlikely because, within the context of the inventive apparatus, a particular resonance element is utilized, namely a dielectric resonator. Finally, by providing a conveying means, for example a pump, a sufficient flow within the individual flexible tube sample vessel may be ensured.

According to the inventive method it is possible to conduct measurements on different portions of the flow of sample substance by gating the flow when conveyed through the resonator and by conducting measurements on the sample substance whenever the flow is stopped. This is essentially independent of the shape of the sample vessel and of the type of resonator used. However, it is preferable to also use an individual flexible tube as a sample vessel and a dielectric resonator as the resonance element.

In a preferred embodiment of the inventive resonator apparatus the flexible tube is made from a material having no ESR signal within an ESR frequency range of ±6% around the ESR frequency of a free electron.

This ensures that no spurious signals are superimposed over the resonance line corresponding to the substance contained in the sample vessel.

Moreover, it is preferable that the material be temperature-resistant up to at least 80° C.

This has the advantage that measurements may be conducted on high-temperature liquids.

One preferred material for the present invention is a fluorethylenepolymer, or still more preferably, polytetrafluorethylene (PDFE). These materials show no ESR signals within the mentioned range and are sufficiently temperature-resistant.

In another group of preferred embodiments of the resonator, an apparatus is provided for thermostatically controlling the sample. The thermostats may be configured as heating means located outside or inside the resonator.

In a particularly preferred embodiment of the invention, the flexible tube is directly connected to the conveying means. This has the advantage that, contrary to prior art apparatuses, no couplings or fittings are required so that all problems relating to corrosion and leaking are avoided. Moreover, a flexible tube is a component that may easily be exchanged so that measurements are also simplified.

In this context it is further preferred that the conveying means be configured as a controllable pump, and particularly as a pump connected to a control unit that cyclically switches the pump on and off.

This has the advantage that the flow of sample substance may be measured stepwise, i.e., always at a moment in time when the flow is stopped and a measurement is conducted within the resonator.

According to further embodiments of the inventive resonator apparatus, the flexible tube is adapted to be fixed within the resonator by means of releasable fasteners. This allows the tube to be easily exchanged.

It is particularly preferred that a guide tube be provided for holding the flexible tube within the resonator. This has the advantage that the flexible tube may particularly easily be guided through the resonator.

It is further preferred in this context that the guide tube be made from an elastic material, and that a chuck be provided for engaging the guide tube and fixing the flexible tube within the guide tube. This has the advantage that the flexible tube may be fixed in a particular way so that, if the chuck is set with too much power, the flexible tube will not be squeezed extensively, because the elastic guide tube is located between the chuck and the flexible tube and the pressure exerted by the chuck is distributed homogeneously.

As already mentioned at the outset, the prior art teaches feeding dielectric resonators either from a microwave coaxial line or from a hollow waveguide. Within the present context it is preferred to feed the resonator via a hollow waveguide.

In connection with the inventive method it is preferable that the sample substance have a non-homogeneous composition and the composition changes in a direction of the flow, preferably sectionwise. Within a further embodiment of the invention this is the case when the flow of sample substance is provided by an auto-sampler directing distinct sample substances into the sample vessel one after another. These measures have the advantage that distinct liquid sample substances may be measured by ESR in a quickly changing mode of operation without incurring the disadvantages of prior art apparatuses and methods. The inventive method, therefore, is particularly suited for measuring the durability of beer by means of electron spin resonance, although it is in no way restricted to that particularly application.

Further advantages will become apparent from the description and the enclosed drawing.

BRIEF DESCRIPTION OF THE DRAWINGS

The features mentioned before, and those that will be explained hereinafter, may be used not only in the particular combinations shown, but also alone or in other combinations, without leaving the scope of the present invention.

Examples of the invention are depicted in the drawings and will be explained in further detail within the subsequent description.

DETAILED DESCRIPTION OF THE PREFERRED EMBODIMENTS

Figure 1:
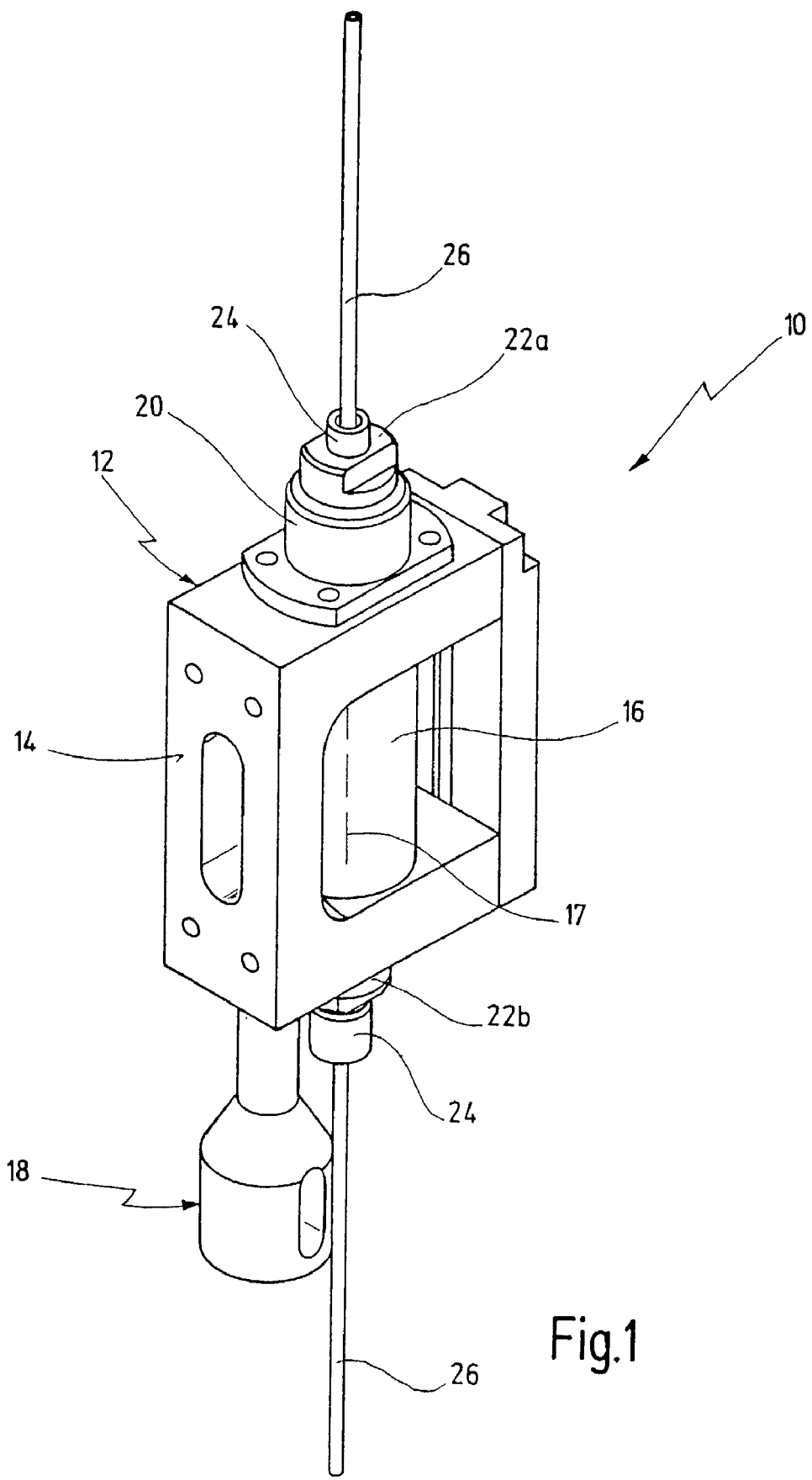
FIG. 1 shows a perspective view of an embodiment of an inventive resonator apparatus.

Within the figures, reference numeral 10 generally designates an ESR resonator having a resonator housing 12 on which a waveguide connector 14 is shown.

Within the interior of resonator housing 12 there is a dielectric resonator 16 defining a longitudinal axis 17. Resonator 16 has the shape of a hollow cylinder and is resonant within the microwave range Resonator 10 is provided with a coupling element 18 located between waveguide connector 14 and dielectric resonator 16, and adapted to be operated from the outside.

The upper side and the bottom side of resonator housing 12 are each provided with a flange, one of them being shown in FIG. 1 at 20. Each flange 20 houses a chuck 22a, 22b. Chucks 22a, 22b grip a guide tube 24 extending through the entire resonator housing 12 and, hence, also through dielectric resonator 16 along axis 17 and protruding beyond resonator housing 12.

Figure 2:
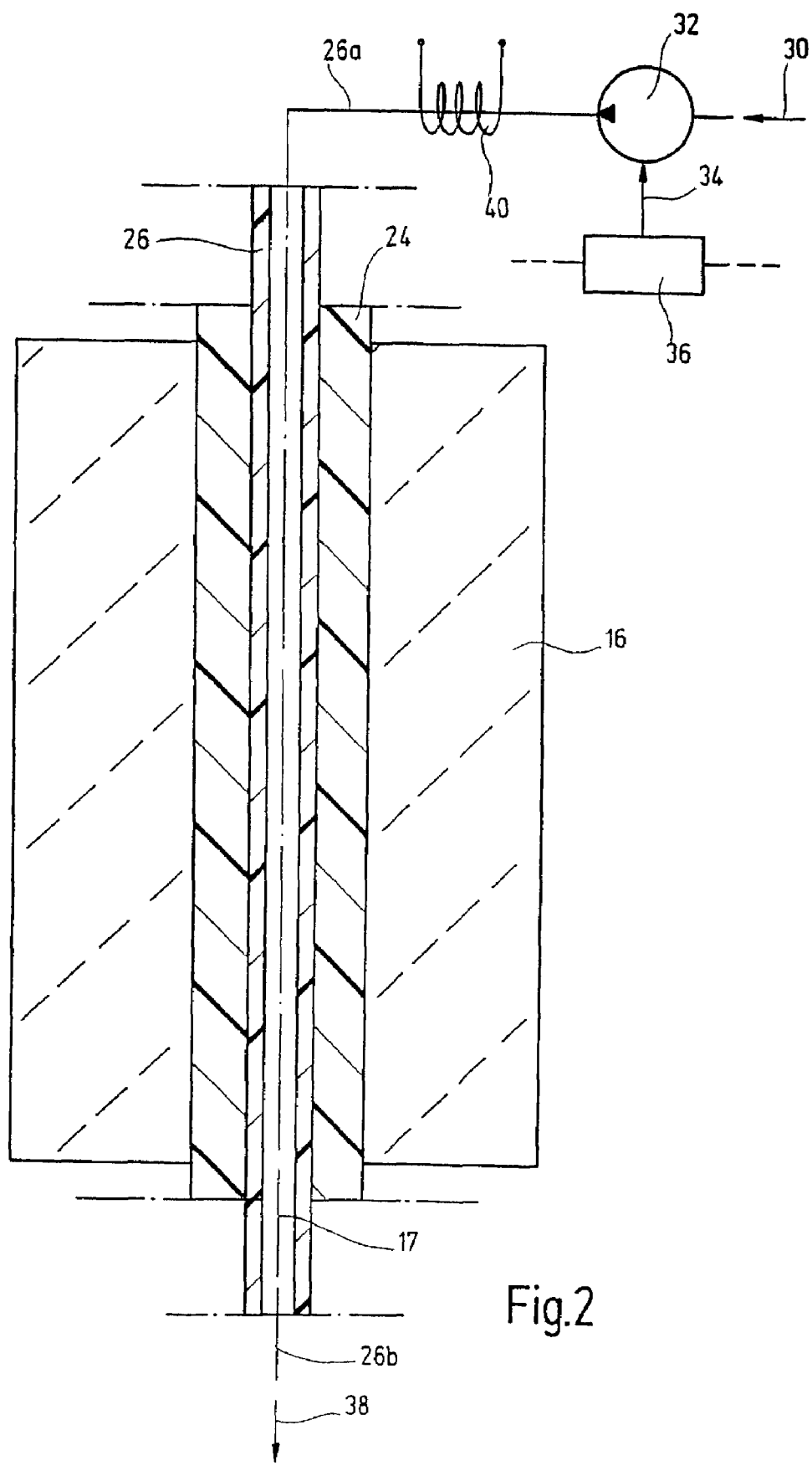
FIG. 2 is an axial partial sectional view of the resonator apparatus according to FIG. 1, on a highly enlarged scale.

As may particularly be taken from FIG. 2, a PTFE flexible tube 26 is guided through guide tube 24 without any couplings or fittings whatsoever.

Reference numeral 30 in FIG. 2 indicates a flow input coming, for example, from an automatic measuring system like an auto-sampler. A pump 32 is provided in the area of flow input 30. Pump 32 may be controlled via a control line 34, from a control unit 36. Control unit 36 is adapted to switch pump 32 on and off cyclically so that a flow of sample substance is cyclically conveyed through flexible tube 26 or stopped, respectively.

At the opposite terminal end of flexible tube 26 reference numeral 38 indicates a flow output which may be configured as a feedback line towards flow input 30, as may be suitable for a particular case of application.

Finally, reference numeral 40 indicates a thermostat serving, preferably, for heating-up the liquid sample substance conveyed within flexible tube 26. Thermostat 40 is indicated in FIG. 2 as being an external unit. However, it goes without saying that it may also be integrated within resonator 10.

Resonator 10 is preferably operated at X-band frequencies, i.e., at a microwave frequency of between 9 and 12 GHz. For ESR measurements this corresponds to a magnetic field strength of approximately 0.35 T.

In order to make sure that the ESR measurements on the liquid sample substance are not disturbed, flexible tube 26, as well as guide tube 24, must consist of a material having no ESR signal within the above-mentioned range. A range of ±6% around the ESR frequency of a free electron (or around the corresponding magnetic field strength at constant microwave frequency) would be sufficient for sample substances being of interest within the present context.

Considering that within the scope of the present invention measurements on heated-up liquid sample substances are preferred, the materials of the aforementioned elements must be temperature-resistant, namely up to 60° C. at a minimum, preferably up to 80° C. These are temperatures at which measurements relating to the durability of beer are conducted when beer is artificially aged by strong heating-up A group of materials having the desired properties, is the group of fluorethylenepolymers, in particular polytetrafluorethylene (PTFE) also known as TEFLON (a registered trademark of E.I. du Pont de Nemours and Company). Flexible tube 26 is preferably made from that material.

Flexible tube 26 is guided up to pump 32 or an automatic measuring system, for example an auto-sampler, without any coupling or fitting. Therefore, flexible tube 26 at one of its terminal ends is connected to the aforementioned unit and, during the setting-up of the measurement, is guided through a resonator 10 while chucks 22a and 22b are loosened. The relatively rigid guide tube 24 helps to introduce flexible tube 26 and makes sure that the flexible tube 26 in the area of dielectric resonator 16 is guided as exactly as possible along the longitudinal axis 17 thereof, where the magnetic radio frequency field strength is at its maximum.

Continuous flexible tube 26 is then guided out of the bottom side of resonator 10 and then connected to flow output 38.

It may be desirable to feed a flow of sample substance to the apparatus via flow input 30 which has a different composition along sections thereof. This may be effected with an auto-sampler by feeding a certain amount of sample substance from individual supply containers to flexible tube 26 one after the other. The quantities of sample substance are dimensioned such that they correspond to an axial length of flexible tube 26 corresponding, in turn, to a fill of resonator 16. Accordingly, sample substances of distinct compositions are arranged one after the other along sections of flexible tube 26, and are conveyed one after the other through resonator 16 by cyclically operating pump 32. As soon as one of these sections of sample substance is arranged within the area of resonator 16, the flow of sample substance is stopped, so that an ESR measurement may be conducted on that particular section of sample substance. Pump 32 may either be operated as a pressure pump or as a suction pump so that the sections of sample substance are conveyed from pump 32 towards resonator 16 or vice versa. Contrary to the depiction in FIG. 2 pump 32 may also be located at the flow output of resonator 16.

By doing so a serial measurement on a plurality of distinct samples may be conducted in an advantageous manner.

The invention claimed is:

1. A resonator apparatus for electron spin resonance (ESR) measurements, the resonator comprising:
   a dielectric ring resonator;
   a coupling element for exciting the dielectric ring resonator with radio frequency energy and for coupling ESR measurement signals out of the dielectric ring resonator;
   a sample vessel extending through said ring resonator, said sample vessel being configured as a single flexible tube;
   a liquid conveyor for conveying a liquid sample substance through said flexible tube while it extends through the ring resonator wherein the flexible tube extends from the liquid conveyor through the dielectric ring resonator with a substantially constant inner diameter; and
   an autosampler for directing distinct sample substances one after another through the liquid conveyor and the flexible tube and for cyclically conveying and stopping the distinct sample substances to produce a flow of the liquid sample substance consisting of a non-homogeneous composition that changes stepwise in a direction of the flow.

2. The resonator apparatus of claim 1, wherein said flexible tube is made from a material having no ESR signal within an ESR frequency range of ±6% around the ESR frequency of a free electron.

3. The resonator apparatus of claim 2, wherein said material is temperature-resistant up to at least 80° C.

4. The resonator apparatus of claim 2, wherein said material is a fluorethylenpolymer.

5. The resonator apparatus of claim 4, wherein said material is polytetrafluoroethylene (PTFE).

6. The resonator apparatus of claim 1, wherein a thermal control apparatus is provided for controlling the temperature of said sample.

7. The resonator apparatus of claim 6, wherein the thermal control apparatus comprises a heater.

8. The resonator apparatus of claim 6, wherein the thermal control apparatus is located outside said resonator.

9. The resonator apparatus of claim 6, wherein the thermal control apparatus is located inside said resonator.

10. The resonator apparatus of claim 1, wherein said flexible tube is connected directly to said liquid conveyor.

11. The resonator apparatus of claim 1, wherein said liquid conveyor is configured as a controllable pump.

12. The resonator apparatus of claim 11, wherein said pump is connected to a control unit for cyclically switching said pump on and off.

13. The resonator apparatus of claim 1, wherein said flexible tube is adapted to be fixed within said resonator by means of releasable fixation elements.

14. The resonator apparatus of claim 1, wherein a guide tube is provided for holding said flexible tube within said resonator.

15. The resonator apparatus of claim 14, wherein said guide tube is made from an elastic material, and a chuck is provided for fixing said flexible tube within said guide tube, said chuck engaging said guide tube.

16. The resonator apparatus of claim 1, wherein said resonator is fed via a hollow waveguide.

17. A method of measuring electron spin resonance (ESR) signals within a resonator apparatus, the method comprising:
   guiding a liquid sample substance from a liquid conveyor through a sample vessel extending through a dielectric ring resonator, the sample vessel being configured as a single, flexible tube which extends from the liquid conveyor through the dielectric ring resonator with a substantially constant inner diameter;
   gating said sample substance by cyclically conveying and stopping a flow of said sample substance consisting of a non-homogeneous composition that changes stepwise in a direction of the flow, the flow being provided by an autosampler directing distinct sample substances into the sample vessel one after another;
   exciting the dielectric ring resonator with radio frequency energy and coupling ESR signals out of said dielectric ring resonator;
   detecting the ESR signals coupled out of the dielectric ring resonator;
   performing an ESR measurement with the detected ESR signals when said flow of sample substance is stopped to generate an output; and
   providing the output to a user.

* * * * *